(12) United States Patent
Zhao et al.

(10) Patent No.: US 11,624,123 B2
(45) Date of Patent: Apr. 11, 2023

(54) METHOD AND APPARATUS OF MONOCRYSTAL GROWTH

(71) Applicant: Zing Semiconductor Corporation, Shanghai (CN)

(72) Inventors: Yan Zhao, Shanghai (CN); Nan Zhang, Shanghai (CN); Weimin Shen, Shanghai (CN); Hanyi Huang, Shanghai (CN)

(73) Assignee: Zing Semiconductor Corporation, Shanghai (CN)

( * ) Notice: Subject to any disclaimer, the term of this patent is extended or adjusted under 35 U.S.C. 154(b) by 44 days.

(21) Appl. No.: 17/162,368

(22) Filed: Jan. 29, 2021

(65) Prior Publication Data
US 2022/0136131 A1 May 5, 2022

(30) Foreign Application Priority Data
Nov. 3, 2020 (CN) .......................... 202011212265.X

(51) Int. Cl.
*C30B 15/20* (2006.01)
*C30B 15/14* (2006.01)

(52) U.S. Cl.
CPC .............. *C30B 15/20* (2013.01); *C30B 15/14* (2013.01)

(58) Field of Classification Search
CPC ....... C30B 29/06; C30B 15/14; C30B 15/203; C30B 15/20; C30B 15/28
See application file for complete search history.

(56) References Cited

U.S. PATENT DOCUMENTS 4,508,970 A * 4/1985 Ackerman .......... G01F 23/2928
422/106
5,961,716 A * 10/1999 White ..................... C30B 15/26
117/14

(Continued)

FOREIGN PATENT DOCUMENTS

CN 200958129 Y 10/2007
CN 111020691 A 4/2020

OTHER PUBLICATIONS

Taiwanese Office Action, dated May 28, 2021, in a counterpart Taiwanese patent application, No. TW 109146673.

*Primary Examiner* — Matthew J Song
(74) *Attorney, Agent, or Firm* — Chen Yoshimura LLP

(57) ABSTRACT

The present invention provides a method and an apparatus of monocrystal growth. The method comprises providing an apparatus comprising a crucible, a first lifting device for lifting the crucible, a deflector tube and a second lifting device for lifting the deflector tube; setting a theoretical distance between the deflector tube and the melt surface, determining a theoretical ratio of the crucible lifting rate relative to the monocrystal lifting rate based on sizes of the crucible and the monocrystal, and starting to grow the monocrystal. During the growth, the position of one or more of the crucible, the deflector tube and the monocrystal is adjusted, the actual distance between the deflector tube and the melt surface is real-time detected, the deviation value between the theoretical and the actual distances is calculated, a variation of the ratio is obtained by the deviation value, and the theoretical ratio is adjusted based on the variation. Based on the variation of the ratio of the crucible lifting rate relative to the monocrystal lifting rate, the speeds of the lifting devices are adjusted to maintain the process lifting rate during the crystal growth without change. The process lifting rate is the lifting rate of the monocrystal ingot (Continued)

relative to the melt surface. The present invention can facilitate to produce the monocrystal with high quality.

6 Claims, 3 Drawing Sheets

(56) References Cited

U.S. PATENT DOCUMENTS

| 2011/0060467 A1* | 3/2011 | Orschel | G05B 11/06 |
| | | | 700/275 |
| 2013/0058540 A1* | 3/2013 | Sugawara | C30B 29/06 |
| | | | 382/106 |

* cited by examiner

METHOD AND APPARATUS OF MONOCRYSTAL GROWTH

BACKGROUND OF THE INVENTION

1. Field of the Invention

The present invention relates to manufacture of silicon wafer, and more particularly to a method and an apparatus of monocrystal growth.

2. Description of the Related Art

Czochralski method (CZ method) is one of common methods for growing monocrystal. In a furnace with a straight body, polycrystalline silicon material is carried by a quartz crucible within the furnace and heated by graphite resistance to form a silicon melt. A seed crystal is inserted into the melt surface to connect with the melt. The seed crystal is rotated, the crucible is rotated in reverse, and the seed crystal is lifted slowly. The CZ method includes seeding, shouldering, crowning, body growing and tailing to grow an ingot with desired diameter and length.

During growth of semiconductor monocrystalline silicon, under constant conditions, the length of the isometric body of the ingot increases continuously, causing the lifted position of the crucible, reduction of the melt, change of the stable state of crystal pulling, and change of axial temperature gradient. Difference of the edge temperature gradient and the central temperature gradient also varied with the increase of the length of the isometric body of the ingot. The phenomenon significantly and adversely affects the grown monocrystal. The distance between the melt surface and the deflector tube significantly affects the axial temperature gradient of the monocrystal growing interface. Within a certain scope, the larger distance corresponds gentler axial temperature gradient. During the crystal pulling, the distance is specifically controlled at different lengths of the isometric body to alter the axial temperature gradient. In conventional technical solutions, the crucible position is adjusted to change the distance between the melt surface and the deflector tube, causing the changes of the crystal lifting rate and the relative lifting rate between the crystal and the melt surface, and the growth quality of monocrystal is affected. Therefore, the inventor provides a novel solution.

SUMMARY

The purpose of the present application is to provide an apparatus and a method of monocrystal growth to solve the problems of the conventional technique. The problem includes the differences of the determined crystal lifting rate and the lifting rate of the crystal relative to the melt surface caused by alteration of the distance between the deflector tube and the melt surface by changing the crucible lifting rate, and affection of the crystal quality.

For the above and the relevant purposes, the present application provides a method for growing monocrystal comprises:

providing an apparatus of monocrystal growth comprising a crucible, a first lifting device for lifting the crucible, a second lifting device for lifting the monocrystal, a deflector tube, and a third lifting device for lifting the deflector tube;

setting a theoretical distance between the deflector tube and the melt surface, determining a theoretical ratio of the crucible lifting rate relative to the monocrystal lifting rate based on sizes of the crucible and the monocrystal, and starting to grow the monocrystal;

adjusting position of one or more of the crucible, the deflector tube and the monocrystal during the growth, and real-time detecting the actual distance between the deflector tube and the melt surface, calculating a deviation value between the theoretical and the actual distances, obtaining a variation of the ratio by the deviation value, and adjusting the theoretical ratio based on the variation, and adjusting the speeds of the second lifting devices based on the variation of the ratio of the crucible lifting rate relative to the monocrystal lifting rate, to maintain the process lifting rate during the crystal growth without change, wherein the process lifting rate is the lifting rate of the monocrystal ingot relative to the melt surface.

The distance between the deflector tube and the melt surface is sometimes briefly called "the distance" hereafter, and the ratio of the crucible lifting rate relative to the monocrystal lifting rate is sometimes briefly called "the ratio" hereafter.

In one embodiment, the theoretical ratio is adjusted by adjustment of the crucible lifting rate and/or the monocrystal lifting rate.

In one embodiment, the method further comprises, after calculating a deviation value between the theoretical and the actual distances, conducting data filtering to the deviation value, and obtaining a variation value of the ratio based on the filtered deviation value.

In one embodiment, the method further comprises conducting data filtering to the variation value of the ratio, and then adjusting the speeds of the second lifting device based on the filtered variation value of the ratio.

In one embodiment, the variation value of the ratio is −5%~5% of the theoretical ratio.

In one embodiment, during the monocrystal growth, the distance change rate slop has a maximum of 0.05 mm/min.

The present application also provides a control module comprising: a processor and a memory; wherein the memory is for storage of computer programs, and the processor is for conduction of the computer programs stored in the memory, thereby the control module conducts the method for growing monocrystal as described in any of the above solutions.

The present application further provides a storage medium for storage of computer programs, comprising: implementation of the method for growing monocrystal as described in any of the above solutions by conducting computer programs by a processor.

The present application further provides an apparatus of monocrystal growth comprises a furnace body, a crucible, a first lifting device for lifting the crucible, a deflector tube, a third lifting device for lifting the deflector tube, a second lifting device for lifting the monocrystal, and a programmable logic controller (PLC). The crucible is disposed within the furnace body for carrying a silicon melt. One terminal of a monocrystal contacts to the melt surface. The first lifting device connects to the crucible and lift the crucible. The deflector tube is disposed within the furnace body and connects to the third lifting device. The deflector tube extends to the above of the melt from the outside of the crucible. The second lifting device connects to another terminal of the monocrystal, and lifts the monocrystal during the crystal growth process. The programmable logic controller (PLC) connects to the first, second and third lifting devices, and controls their lifting rates to maintain the process lifting rate during the crystal growth without change, wherein the process lifting rate is the lifting rate of the monocrystal relative to the melt surface.

Accordingly, the apparatus and the method of monocrystal growth provide the advantages including the improvement of the control method as well as the procedure of the PLC. While altering the distance between the deflector tube and the melt surface by altering the crucible lifting rate, the lift of the crucible and the crystal is linkage to maintain the process lifting rate (i.e. the lifting rate of the monocrystal relative to the melt surface) as constant and stabilize the crystal growth conditions. Thereby, the present application can facilitate to produce the monocrystal with high quality.

DETAILED DESCRIPTION OF THE EMBODIMENTS

Figure 1:
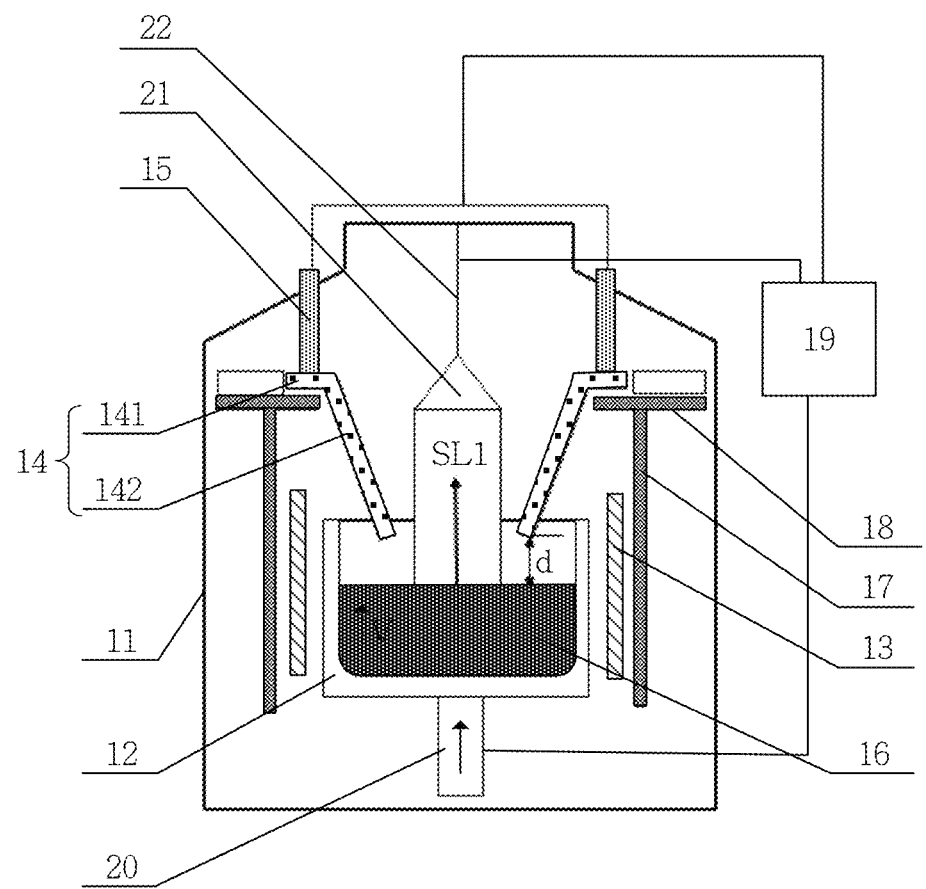
FIG. 1 is a diagram illustrating a structure of an apparatus of monocrystal growth in the present application.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Please refer FIG. 1 to FIG. 4. It should be understood that the present invention may be practiced in different forms and that neither should be construed to limit the scope of the disclosed examples. On the contrary, the examples are provided to achieve a full and complete disclosure and make those skilled in the art fully receive the scope of the present invention. In the drawings, for clarity purpose, the size and the relative size of layers and areas may be exaggerated. In the drawings, same reference number indicates same element.

As shown in FIG. 1, the present application provides an apparatus of monocrystal growth comprises a furnace body 11, a crucible 12, a first lifting device 20 for lifting the crucible, a deflector tube 14, a third lifting device 15 for lifting the deflector tube, a second lifting device 22 for lifting the monocrystal, and a programmable logic controller (PLC) 19. The crucible 12 is disposed within the furnace body 11 for carrying a silicon melt 16. One terminal of a monocrystal 21 contacts to the surface of the silicon melt 16, the monocrystal is generally called seed crystal at initial stage, and a part of the seed crystal is immersed in the melt and then gradually pulled to grow. The first lifting device 20 connects to the crucible 12 and lift the crucible 12. The deflector tube 14 is disposed within the furnace body 11 and connects to the third lifting device 15. The deflector tube 14 extends to the above of the melt 16 from the outside of the crucible 12. The second lifting device 22 connects to another terminal of the monocrystal 21, and lifts the monocrystal during the crystal growth process. The PLC 19 connects to the first, second and third lifting devices 20, 22 and 15, and controls their lifting rates to maintain the process lifting rate during the crystal growth without change, wherein the process lifting rate is the lifting rate of the monocrystal relative to the melt surface.

The lifting rate of the second lifting device 22, i.e. the lifting rate of the monocrystal, is defined as SL1. The process the lifting rate, i.e. the lifting rate of the crystal relative to the melt surface, is defined as SL2. The speed change of the melt surface position is defined as V. Accordingly, it can obtain an equation: SL1=SL2+V. To achieve a predicted distance between the deflector tube and the melt surface, V is variable during entire process of the monocrystal growth. In conventional technique, SL1 is generally a predicted constant, causing the change of SL2 significantly affects the monocrystal perfection. In the present application, the control method and the procedure of PLC are improved to alter the distance between the deflector tube and the melt surface by altering the crucible lifting rate, and, simultaneously, make the lift of the crucible and the crystal as linkage to maintain the process lifting rate (i.e. the lifting rate of the monocrystal relative to the melt surface) without change and stabilize the crystal growth conditions. Thereby, the present application can facilitate to produce the monocrystal with high quality.

It should be described that the silicon raw material in the crucible 12 is solid at initial stage. It is heated by the heater 13 surrounding the crucible and melt to be the silicon melt 16. The distance between the deflector tube 14 and the surface of the melt 16 means the distance d between the lowest point of the deflector tube 14 and the liquid surface of the silicon melt 16. The deflector tube 14 is a part for establishment of the graphite thermal field. During the monocrystal growth, the deflector tube 14 introduces an inert gas such as argon downward to the surface of the melt 16 to take silica (SiO) away, cool the monocrystalline silicon ingot, increase the axial temperature gradient of the ingot (i.e. the temperature at the vertical growing orientation) and facilitate the monocrystal growth. The distance d is an important parameter during the isometric body growth. It is detrimental for monocrystal growth if the distance d is excess large or excess small. Different lengths of the isometric monocrystal corresponds to different distance d value. In the monocrystal growth, the distance d is maintained as a constant during the isometric body growth as possible to ensure the crystal quality. In the monocrystal growth in conventional technique, the increase of the distance d because of consumption of the silicon melt is compensated by lifting the crucible. However, the position change of the crucible also causes the changes of the crystal lifting rate and the process lifting rate, thereby the melt has unstable convection. Accordingly, it fails to maintain stable growth conditions, causing the change of the process lifting rate, i.e. the lifting rate of the monocrystal relative the melt surface, and deterioration of the produced ingot. The present application provide a solution for the above issues.

In one embodiment, the deflector tube 14 includes a horizontal part 141 and a slant part 142. The horizontal part 141 has one terminal adjacent the inner wall of the furnace body 11 and this terminal connects to a gas source, and another terminal extending toward the midline of the furnace 11. The slant part 142 has one terminal connecting to the terminal of horizontal part 141 opposite to the inner wall of the furnace body 11, and another terminal extending to the above of the melt 16. A rod 151 connects to the horizontal part 141. The slant part 142 is slant and has an angle of 30~75° with the horizontal plane, to uniformly introduce the inert gas to the melt surface without fluctuation of the liquid surface. The size of the slant part 142 can gradually enlarge toward the crucible, i.e. like a trumpet, to supply the inert gas to the melt surface more uniformly, and enhance temperature consistence on same plane. It ensures temperature consistence during the isometric body growth.

In one embodiment, the apparatus of monocrystal growth further comprises a graphite layer 17 located between the furnace body 11 and the heater 13. The graphite layer 17 is used for thermal insulation and preservation. In one embodiment, the apparatus of monocrystal growth further comprises a graphite lid 18 located on the top of the graphite layer 17 and the lower part of the horizontal part of the deflector tube 14. The heat escape can be reduced by coaction of the graphite layer 17 and the graphite lid 18.

In one embodiment, the first lifting device 20 can connect to the bottom and/or the top of the crucible 12 to lift the crucible 12.

The key point of the apparatus of the present application is mainly on the improvements of the PLC control method and procedure. The remaining parts of the apparatus are similar to conventional ones, so that detail description is not required.

Figure 2:
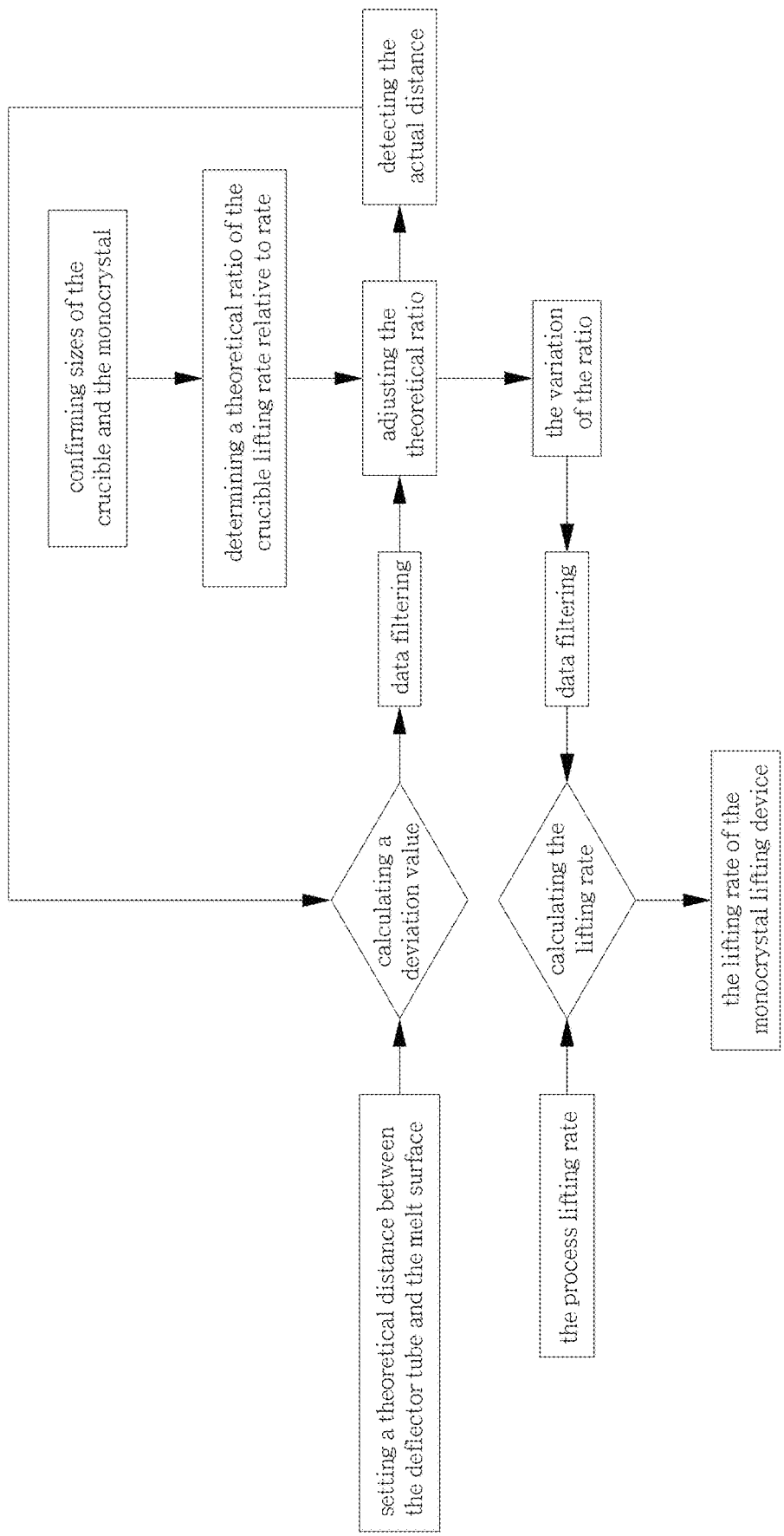
FIG. 2 is a flowchart illustrating method steps for monocrystal growth in the present application.

As shown in FIG. 2, the present application provides a method of monocrystal growth comprising the following steps.

An apparatus of monocrystal growth is provided. The apparatus comprises a crucible, a first lifting device for lifting the crucible, a second lifting device 22 for lifting the monocrystal, a deflector tube, a third lifting device for lifting the deflector tube. For example, the apparatus as shown in FIG. 1, or, any of the above described apparatuses can be used to the method of monocrystal growth of the present application. Accordingly, the above detail descriptions involving the apparatus can be introduced herein.

A theoretical distance between the deflector tube and the melt surface is set. A theoretical ratio of the crucible lifting rate relative to the monocrystal lifting rate is determined based on sizes of the crucible and the monocrystal, and the monocrystal growth can be started. Specifically, according to the specification of the crucible and the desired size of the monocrystal ingot, the theoretical ratio of the crucible lifting rate relative to the monocrystal lifting rate is calculated based on the theoretical formula. The calculation process is shown as follows.

According to law of conservation of mass, the increased mass of the ingot, $M_s$, during unit time $\Delta t$ in the isometric body growth stage should be equal to the reduced mass of the silicon melt, $M_l$, during the unit time. Namely, $$M_s = M_l \tag{1}$$

$$M_s = \rho_s \times V_s = \rho_s \times \Delta t \times U_s \times \pi \times \left(\frac{D_s}{2}\right)^2 \tag{2}$$

$$M_l = \rho_l \times V_l = \rho_l \times \Delta t \times U_c \times \pi \times \left(\frac{D_l}{2}\right)^2 \tag{3}$$

wherein $\rho_s$ is the density of the monocrystal at ambient temperature, $\rho_l$ is the density of the monocrystal at temperature of melting point, $V_s$ is the increased volume of the monocrystal during unit time, $V_l$ is the decreased volume of the silicon melt during unit time, $U_s$ is the monocrystal growing speed, $U_c$ is the lowering speed of the melt surface, which is equal to the crucible lifting speed, $D_s$ is the diameter of the monocrystal ingot, $D_l$ is the diameter of the melt surface, i.e. the inner diameter of the crucible at the position of the melt surface. According to formulae (1), (2) and (3), an expression K of the theoretical ratio of the crucible lifting rate relative to the monocrystal lifting rate is obtained:

$$K = \frac{U_c}{U_s} = \frac{\rho_s \times (D_s)^2}{\rho_l \times (D_l)^2}. \tag{4}$$

After calculating the theoretical ratio, one terminal of the monocrystal, i.e. seed crystal, contacts to the silicon melt, while another terminal connects to the second lifting device. According to the theoretical ratio and the theoretical distance, initial parameters of every structure are set, and then the apparatus is turned on to start the monocrystal growth.

During the monocrystal growth, the position of one or more of the crucible, the deflector tube and the monocrystal are adjusted via the corresponding lifting devices. Real-time detection is conducted to obtain the actual distance between the deflector tube and the melt surface. A deviation value between the theoretical and the actual distances is calculated, and a variation of the ratio of the crucible lifting rate relative to the monocrystal lifting rate is obtained by the deviation value. The theoretical ratio is adjusted based on the variation. The theoretical ratio is adjusted by adjustment of the crucible lifting rate, the monocrystal lifting rate, or both.

The speeds of the second lifting devices is adjusted based on the variation of the ratio of the crucible lifting rate relative to the monocrystal lifting rate, to maintain the process lifting rate during the monocrystal growth without change. The process lifting rate is the lifting rate of the monocrystal ingot relative to the melt surface. Namely, it adjusts the original theoretical ratio, and then conducts fine adjustment via a feedback mechanism, to maintain the process lifting rate during the crystal growth without change.

In the present application, while altering the distance between the deflector tube and the melt surface by altering the crucible lifting rate, the lift of the crucible and the crystal is linkage to maintain the process lifting rate (i.e. the lifting rate of the monocrystal relative to the melt surface) as constant and stabilize the crystal growth conditions. Thereby, the present application can facilitate to produce the monocrystal with high quality.

In one embodiment, the theoretical ratio of the crucible lifting rate relative to the monocrystal lifting rate is adjusted by adjustment of the crucible lifting rate and/or the monocrystal lifting rate.

In one embodiment, after calculating the deviation value between the theoretical and the actual distances, the data filtering is conducted to the deviation value, and the variation value of the ratio is obtained based on the filtered deviation value. The data filtering includes, but not be limited to, arithmetic mean filtering, moving average filtering and the like. For example, average filtering is conducted to plural deviation values obtained within a shorter time period to increase adjustment accuracy and reduce adjustment frequency to stabilize the monocrystal growing conditions.

In one embodiment, the data filtering is conducted to the variation value of the ratio of the crucible lifting rate relative to the monocrystal lifting rate, and then the speeds of the second lifting device is adjusted based on the filtered variation of the ratio. Similarly, the data filtering includes, but not be limited to, arithmetic mean filtering, moving average filtering and the like. The adjustment accuracy can be increased by the data filtering.

It is inappropriate to adjust the ratio drastically because the drastic adjustment brings significant fluctuation to the growth conditions. In one embodiment, the variation value of the ratio is −5%~5% of the theoretical ratio, namely, the ratio is adjusted within the scope of ±5% of the original theoretical ratio.

Similarly, drastic change of the distance is inappropriate during the monocrystal growth. In one embodiment, during the monocrystal growth, the maximum slope of the speed change of the distance is 0.05 mm/min. The speed change of the distance is an outcome of comprehensive actions by the lifting rate of the deflector tube and the lifting rate of the crucible, so that the distance can be changed gradually and gently via the linkage of the lifting rates of the deflector tube and the crucible.

Figure 3:
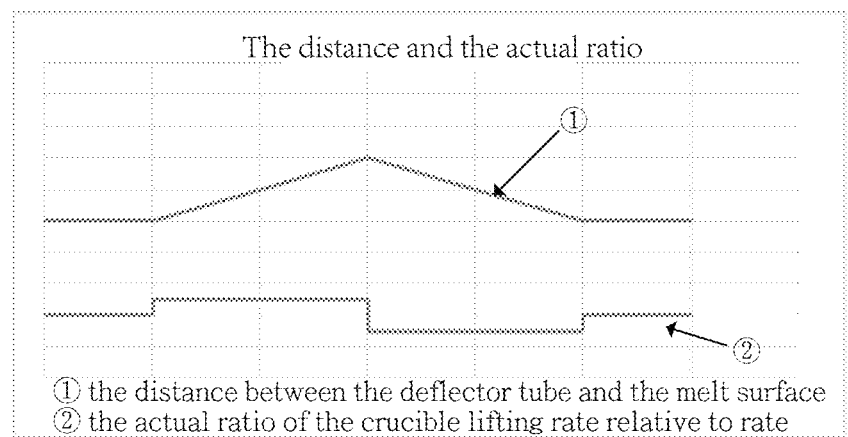
FIG. 3 shows the changes of the distance between the deflector tube and the melt surface ① and the actual ratio of the crucible lifting rate relative to rate ② during the conventional monocrystal growth.
Figure 4:
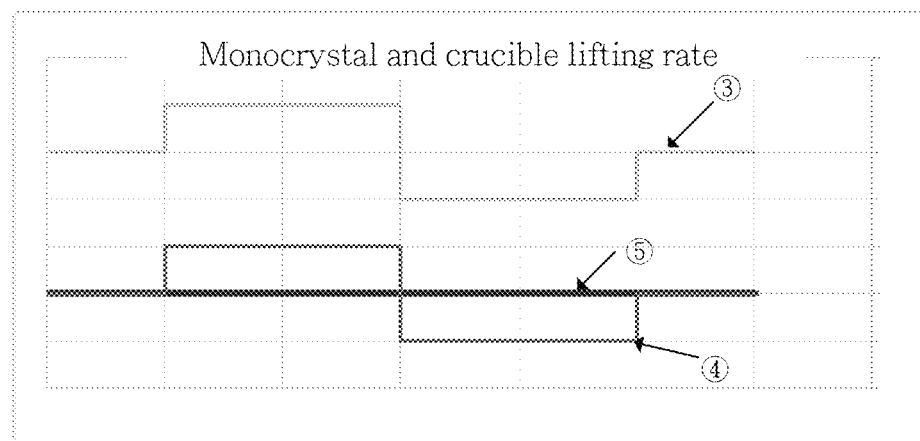
FIG. 4 shows the changes of and the crucible lifting rate ③, the rate of monocrystal lifting device ④ and the process lifting rate ⑤ during the monocrystal growth in the present application.

In the conventional method of monocrystal growth, the curve diagrams of changes of the distance and the actual ratio are shown in FIG. 3, in which the curve ① shows the change of the distance and the curve ② shows the change of the actual ratio. It can be observed from FIG. 3 that the distance has a significant fluctuation in the conventional method of monocrystal growth. FIG. 4 illustrates the curve diagrams of several parameters during the monocrystal growth by applying the method of the present application, wherein the curve ③ shows the change of the crucible lifting rate, the curve ④ shows the change of the lifting rate of the second lifting device, and the curve ⑤ shows the change of the process lifting rate. It can be observed from FIG. 4 that, during the entire monocrystal growth, the process lifting rate is maintained constantly because of the synchronous linkage of the changes of the crucible lifting rate and the monocrystal lifting rate. Accordingly, it facilitates to stabilize growth conditions and increase the crystal quality. This method of monocrystal growth has been applied to the inventor's factory currently, and the defects of the produced crystals are significantly reduced.

The present application also provides a control module, which comprises a processor 31 and a memory 32. The memory 32 is for storage of computer programs, and the processor 31 is for conduction of the computer programs stored in the memory 32, thereby the control module conducts any of the above described solutions of the monocrystal growing method.

It should be understood that division of the units of the foregoing module is merely division of logical functions. During actual implementation, all or some of the units may be integrated into a physical entity, or may be physically separated. Moreover, these units may be all implemented in a form of software invoked by a processing element, or may be all implemented by hardware, or some units may be implemented in a form of software invoked by a processing element, and some units may be implemented by hardware. For example, the processor may be a separately disposed processing element, or may be integrated into a chip of the device. Alternatively, the processor may be stored in a memory of the device as a program and invoked by a processing element of the device to perform a function of the unit. Implementation of other units is similar thereto. In addition, all or some of these units may be integrated or separately implemented. The processing element herein may be an integrated circuit having a signal processing capability. In an implementation process, the steps of the foregoing method or the foregoing module may be completed by using a hardware-integrated logic circuit in a processor element or instructions in a form of software.

For example, the foregoing units may be configured as one or more integrated circuits for implementing the foregoing method, for example, one or more application-specific integrated circuits (ASIC), or one or more digital signal processor (DSP), or one or more field-programmable gate arrays (FPGA). For another example, when a unit above is implemented in a form of a program scheduled by a processing element, the processing element may be a general purpose processor, for example, a central processing unit (CPU) or another processor that can invoke a program. For another example, these units may be integrated, and implemented in a system-on-a-chip (SOC) form.

Figure 5:
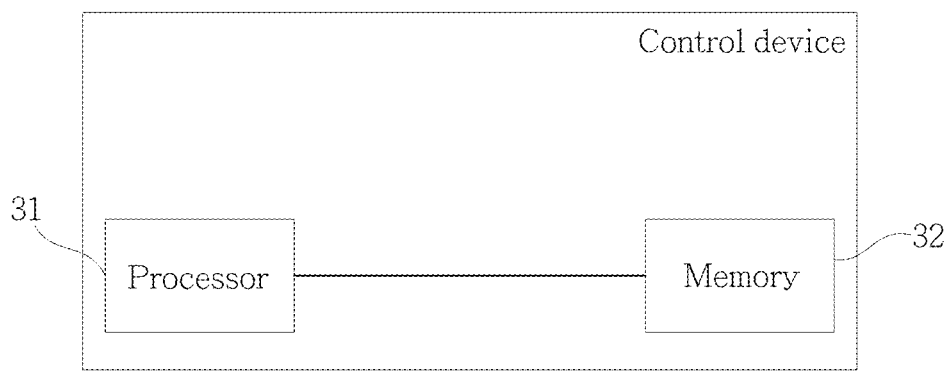
FIG. 5 is a diagram illustrating a module of a control device in the present application.

In one embodiment, as shown in FIG. 5, the control module includes a processor 31 and a memory 32.

The memory 32 is for storage of computer programs.

The memory 32 includes any medium which can store codes such as ROM, RAM, disk, USB flash drive, memory card, compact disk and the like.

The processor 31 connects to the memory 32 and conducts the computer programs stored in the memory 32, thereby the control module conducts any of the above described solutions of the method for growing monocrystal.

Preferably, the processor 31 can be a general purpose processor such as central processing unit (CPU), network processor (NP) and like; a digital signal processor (DSP), an application specific integrated circuit (ASIC), a field programmable gate array (FPGA); or other programmable logic devices such as discrete component gate, transistor logic device, discrete hardware unit and the like.

The present application further provides a storage medium for storage of computer programs. When the computer program is conducted by a processor, any of the above described solutions of the method for growing monocrystal is implemented.

Preferable, the memory includes any medium which can store codes such as ROM, RAM, disk, USB flash drive, memory card, compact disk and the like.

According to the above, the present application provides a method and an apparatus of monocrystal growth. The method comprises providing an apparatus of monocrystal growth comprising a crucible, a first lifting device for lifting the crucible, a second lifting device for lifting the monocrystal, a deflector tube, and a third lifting device for lifting the deflector tube; setting a theoretical distance between the deflector tube and the melt surface, determining a theoretical ratio of the crucible lifting rate relative to the monocrystal lifting rate based on sizes of the crucible and the monocrystal, and starting to grow the monocrystal; adjusting position of one or more of the crucible, the deflector tube and the monocrystal during the growth, and real-time detecting the actual distance between the deflector tube and the melt surface, calculating a deviation value between the theoretical and the actual distances, obtaining a variation of the ratio by the deviation value, and adjusting the theoretical ratio based on the variation; and adjusting the speeds of the second lifting devices based on the variation of the ratio of the crucible lifting rate relative to the monocrystal lifting rate, to maintain the process lifting rate during the monocrystal growth without change, wherein the process lifting rate is the lifting rate of the monocrystal ingot relative to the melt surface. In the present application, the control method and the procedure of PLC are improved to alter the distance between the deflector tube and the melt surface by altering the crucible lifting rate, and, simultaneously, make the lift of the crucible and the crystal as linkage to maintain the process lifting rate (i.e. the lifting rate of the monocrystal relative to the melt surface) without change and stabilize the crystal growth conditions. Thereby, the present application can facilitate to produce the monocrystal with high quality.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A method for growing monocrystal comprising:
providing an apparatus of monocrystal growth comprising a crucible, a first lifting device for lifting the crucible, a second lifting device for lifting the monocrystal, a deflector tube, and a third lifting device for lifting the deflector tube;
setting a theoretical distance between the deflector tube and the melt surface, determining a theoretical ratio of the crucible lifting rate relative to the monocrystal lifting rate based on sizes of the crucible and the monocrystal, and starting to grow the monocrystal;
adjusting position of one or more of the crucible, the deflector tube and the monocrystal during the growth, and real-time detecting the actual distance between the deflector tube and the melt surface,
calculating a deviation value between the theoretical and the actual distances and then conducting data filtering to the deviation value,
obtaining a variation value of the ratio by the filtered deviation value, and adjusting the theoretical ratio based on the variation value,
wherein the theoretical ratio is adjusted by adjustment of the crucible lifting rate and/or the monocrystal lifting rate, and
adjusting the speeds of the second lifting device based on the variation of the ratio of the crucible lifting rate relative to the monocrystal lifting rate, to maintain the process lifting rate during the crystal growth without change,
wherein the process lifting rate is, during growth of the isometric body portion, the lifting rate of the monocrystal ingot relative to the melt surface.

2. The method of claim 1, further comprising conducting data filtering to the variation value of the ratio, and then adjusting the speeds of the second lifting device based on the filtered variation value of the ratio.

3. The method of claim 1, wherein the variation value of the ratio is −5%~5% of the theoretical ratio.

4. The method of claim 1, wherein, during the monocrystal growth, the distance change rate slop has a maximum of 0.05 mm/min.

5. A control module comprising: a processor and a memory; wherein the memory is for storage of computer programs, and the processor is for conduction of the computer programs stored in the memory, thereby the control module conducts the method for growing monocrystal as claimed in claim 1.

6. A storage medium for storage of computer programs, comprising: implementation of the method for growing monocrystal as claimed in claim 1 by conducting computer programs by a processor.

* * * * *